United States Patent
Okada et al.

(10) Patent No.: US 8,168,252 B2
(45) Date of Patent: May 1, 2012

(54) ELECTROMAGNETIC WAVE SHIELDING MATERIAL AND PROCESS FOR PRODUCING THE SAME

(75) Inventors: Atsushi Okada, Moriyama (JP); Akio Kiyohara, Moriyama (JP); Hideki Tanaka, Moriyama (JP); Toshiyuki Honda, Saitama (JP); Masafumi Ito, Saitama (JP); Junichi Kato, Uji (JP); Noboru Toshima, Kyoto (JP); Yasuhisa Nakao, Kyoto (JP)

(73) Assignees: Gunze Limited, Ayabe-Shi, Kyoto (JP); Fujikura Kasei Co., Ltd., Tokyo (JP)

( * ) Notice: Subject to any disclaimer, the term of this patent is extended or adjusted under 35 U.S.C. 154(b) by 1262 days.

(21) Appl. No.: 11/569,544

(22) PCT Filed: May 19, 2005

(86) PCT No.: PCT/JP2005/009173
§ 371 (c)(1), (2), (4) Date: Nov. 22, 2006

(87) PCT Pub. No.: WO2005/115070
PCT Pub. Date: Dec. 1, 2005

(65) Prior Publication Data
US 2007/0212536 A1    Sep. 13, 2007

(30) Foreign Application Priority Data
May 24, 2004    (JP) .................................. 2004-153343

(51) Int. Cl.
*H01J 11/02* (2006.01)
(52) U.S. Cl. ...................................................... 427/96.3
(58) Field of Classification Search .................. 427/96.3
See application file for complete search history.

(56) References Cited

U.S. PATENT DOCUMENTS
6,399,879 B1    6/2002    Ueda et al.
(Continued)

FOREIGN PATENT DOCUMENTS
CN    1440234 A    9/2003
(Continued)

OTHER PUBLICATIONS
International Search Report dated Aug. 2, 2005, International Application No. PCT/JP2005/009173.
(Continued)

*Primary Examiner* — Michael Cleveland
*Assistant Examiner* — Tabassom Tadayyon Eslami
(74) *Attorney, Agent, or Firm* — Westerman, Hattori, Daniels & Adrian, LLP

(57) ABSTRACT

The present invention provides an electromagnetic wave shielding material that has high electromagnetic wave shielding effects, excellent transparency, and excellent see-through property, and a simple and inexpensive production process for the electromagnetic wave shielding material. Specifically, the present invention provides a process for producing an electromagnetic wave shielding material, the process comprising screen-printing in a geometric pattern a conductive paste containing a particulate silver oxide, a tertiary fatty acid silver salt, and a solvent, onto a transparent porous layer surface of a transparent resin substrate having a transparent porous layer containing as a main component at least one member selected from the group consisting of oxide ceramics, non-oxide ceramics, and metals; and performing heat treatment to form a conductive region with a geometric pattern on the transparent porous layer surface; and an electromagnetic wave shielding material produced by the production process.

14 Claims, 2 Drawing Sheets

(a)

(b)

U.S. PATENT DOCUMENTS

| | | | |
|---|---|---|---|
| 6,433,481 B1 * | 8/2002 | Marutsuka | 313/634 |
| 6,452,331 B1 * | 9/2002 | Sakurada et al. | 313/582 |
| 6,586,871 B1 * | 7/2003 | Horie et al. | 313/461 |
| 6,733,869 B2 | 5/2004 | Arakawa et al. | |
| 6,942,825 B2 | 9/2005 | Honda et al. | |
| 2005/0233070 A1 * | 10/2005 | Pellerite et al. | 427/164 |

FOREIGN PATENT DOCUMENTS

| | | |
|---|---|---|
| JP | 02-052499 | 2/1990 |
| JP | 2-52499 A | 2/1990 |
| JP | 11-026984 | 1/1999 |
| JP | 2001-196784 | 7/2001 |
| JP | 2001-196784 A | 7/2001 |
| JP | 2001-217589 | 8/2001 |
| JP | 2001-217589 A | 8/2001 |
| JP | 2002-057490 | 2/2002 |
| JP | 2002-57490 A | 2/2002 |
| JP | 2003-203522 * | 8/2003 |
| JP | 2004-031876 | 1/2004 |
| JP | 2004-31876 A | 1/2004 |
| JP | 2004-172554 * | 6/2004 |
| JP | 2004-312014 | 11/2004 |
| JP | 2004-312014 A | 11/2004 |
| WO | WO 03038838 A1 | 5/2003 |

OTHER PUBLICATIONS

Japanese Office Action dated Feb. 9, 2010, issued in corresponding Japanese Patent Application No. 2006-513721 (Translation Only).

Japanese Office Action dated Nov. 4, 2009, issued in correspondiong Japanese Patent Application No. 2006-513721 (With English Translation).

International Search Report of PCT/JP2005/009173, date of mailing: Aug. 5, 2005.

* cited by examiner

[Fig. 1]
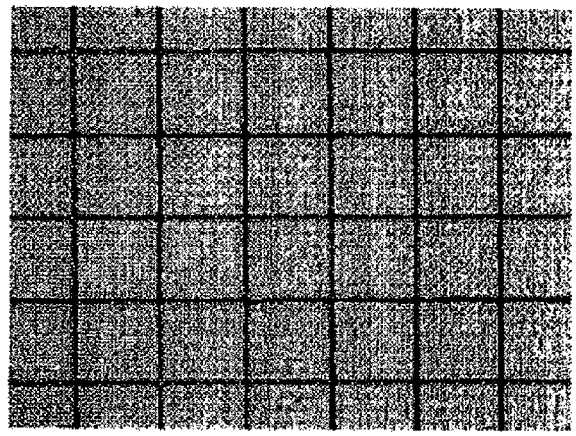
[Fig. 2]
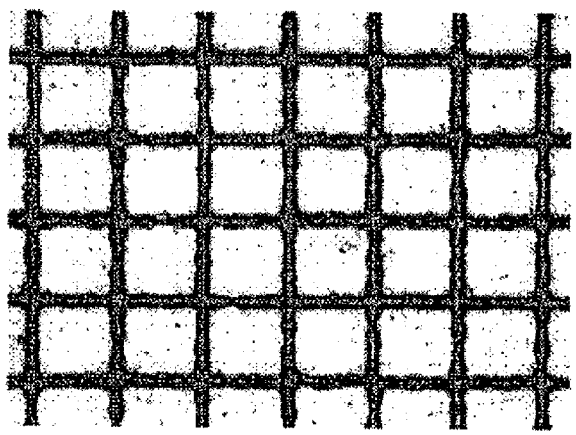
[Fig. 3]
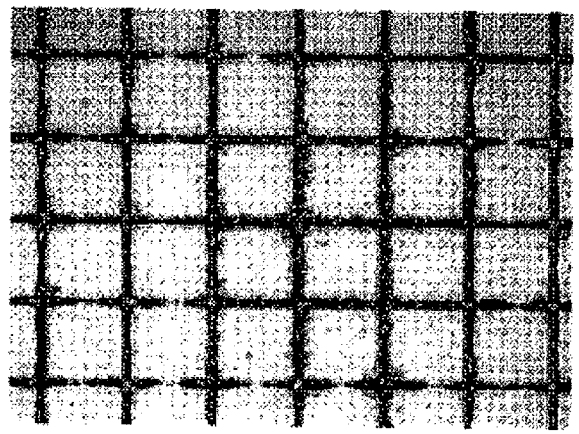

[Fig. 4]
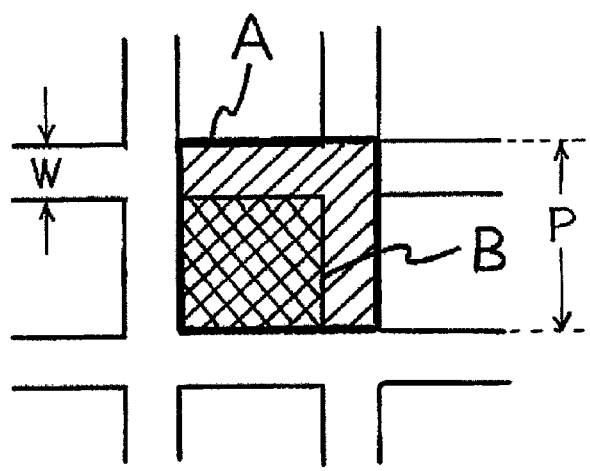
[Fig. 5]
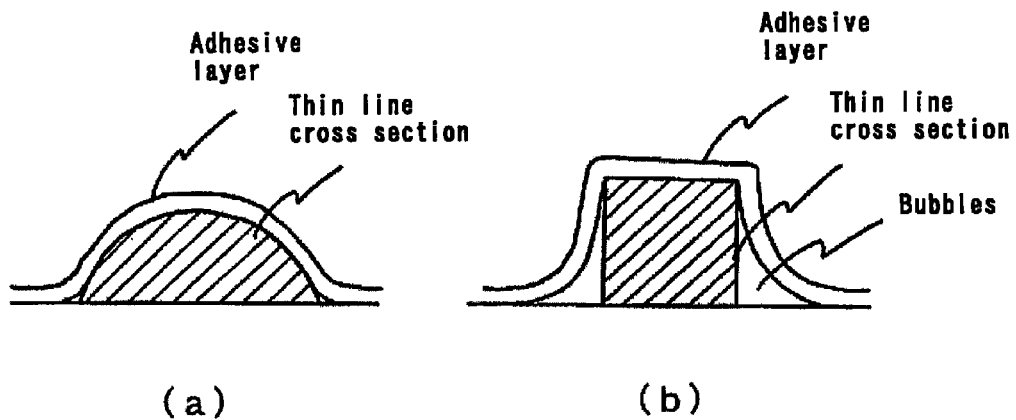
(a)　　　　　　　　(b)

ELECTROMAGNETIC WAVE SHIELDING MATERIAL AND PROCESS FOR PRODUCING THE SAME

TECHNICAL FIELD

The present invention relates to an electromagnetic wave shielding material for shielding electromagnetic waves emitted from electrical apparatus such as CRTS, PDPs, etc., and a process for producing the same.

BACKGROUND ART

Various products have been produced by forming electrically conductive and/or magnetic patterns on substrates to use the electrical properties, magnetic properties, etc. of the patterns. Among such products, electromagnetic wave shielding plates are widely used as front plates to be mounted on the front of displays of CRTs, PDPS, etc. in order to shield electromagnetic waves leaking from the display screens. Electromagnetic wave shielding plates for use as front plates are required not only to have a function of shielding electromagnetic waves, but also to not deteriorate the see-through property of the display screens.

For example, electromagnetic wave shielding materials having conductive regions formed on transparent resin substrate surfaces by screen printing using a conductive powder and a binder have been reported as electromagnetic wave shielding materials that have both see-through property and electromagnetic wave shielding properties (Patent Documents 1 and 2).

Generally, however, when forming a shield layer with a grid pattern by screen printing, printing defects such as moire caused by interference with the mesh of the screen of the printing plate, breaking and thickening of thin lines, etc., are likely to occur, making precise printing difficult. This is likely to cause problems such as reduction of electromagnetic wave shielding capability, deterioration of see-through property, etc.

Patent Document 1: Japanese Unexamined Patent Application Publication No. 1999-26984
Patent Document 2: Japanese Unexamined Patent Application Publication No. 2001-196784

DISCLOSURE OF THE INVENTION

Problems to be Solved by the Invention

An object of the present invention is to provide an electromagnetic wave shielding material that has high electromagnetic wave shielding effects, excellent transparency and excellent see-through property; and a simple and inexpensive production process for the electromagnetic wave shielding material.

Means for Solving the Problems

The present inventors conducted extensive research to achieve the above objects, and found that when a specific conductive paste is screen-printed in a geometric pattern onto the transparent porous layer surface of a transparent resin substrate having a transparent porous layer containing as a main component at least one member selected from the group consisting of oxide ceramics, non-oxide ceramics, and metals, and then the conductive paste is baked at a relatively low temperature, it is possible to form on the transparent porous layer surface a conductive region with a geometric pattern of thin lines that are substantially free from breaking or thickening, and to thereby produce an electromagnetic wave shielding material having excellent electromagnetic wave shielding effects, high aperture ratio (see-through property) and transparency. The present inventors conducted further research based on these findings, and accomplished the present invention.

The present invention provides the following electromagnetic wave shielding materials and processes for producing the same.

Item 1. A process for producing an electromagnetic wave shielding material, the process comprising screen-printing in a geometric pattern a conductive paste comprising a particulate silver oxide, a tertiary fatty acid silver salt, and a solvent, onto a transparent porous layer surface of a transparent resin substrate having a transparent porous layer containing as a main component at least one member selected from the group consisting of oxide ceramics, non-oxide ceramics, and metals; and then heat-treating the printed transparent resin substrate to form a conductive region with a geometric pattern on the transparent porous layer surface.

Item 2. A process according to Item 1, wherein the transparent resin substrate has a hard coat layer on a surface opposite the transparent porous layer.

Item 3. The process according to Item 1 or 2, wherein the conductive paste contains a particulate silver oxide with a mean particle diameter of not more than 2 µm, a silver salt of a tertiary fatty acid having a total carbon number of 5 to 30, and a solvent containing as a main component at least one member selected from the group consisting of aromatic hydrocarbons, ether esters of ethylene glycol, ether esters of propylene glycol, and terpineol.

Item 4. A process according to any one of Items 1 to 3, wherein the transparent porous layer has a thickness of about 0.05 to about 20 µm.

Item 5. A process according to any one of Items 1 to 4, wherein the transparent porous layer comprises an aggregate of fine particles containing as a main component at least one member selected from the group consisting of silica, titania, and alumina, and has pores between the fine particles.

Item 6. A process according to Item 5, wherein the fine particles have a mean particle diameter of about 10 to about 100 nm, and wherein the pores have a diameter of about 10 to about 100 nm.

Item 7. A process according to Item 1, wherein the transparent porous layer is formed by a method selected from the group consisting of gravure coating, offset coating, comma coating, die coating, slit coating, spray coating, plating, sol-gel processes, LB film processes, CVD, vapor deposition, sputtering, and ion plating.

Item 8. A process according to any one of Items 1 to 7, wherein the heat treatment is carried out at a temperature of about 150 to about 200° C.

Item 9. A process according to any one of Items 1 to 8, wherein the transparent resin substrate comprises at least one resin selected from the group consisting of polyester resins, polycarbonate resins, poly(meth)acrylate resins, silicone resins, cyclic polyolefin resins, polyarylate resins, and polyether sulfone resins.

Item 10. A process according to any one of Items 1 to 9, wherein the transparent resin substrate has a form of a sheet, a film, or a plate.

Item 11. An electromagnetic wave shielding material produced by a process according to any one of Items 1 to 10.

Item 12. An electromagnetic wave shielding material according to Item 11, wherein the geometric pattern of the conductive region has a line width of about 10 to about 30 µm, and wherein the electromagnetic wave shielding material has an aperture ratio of about 80 to about 95%.

Item 13. A film-form electromagnetic wave shielding material comprising a conductive region with a geometric pattern formed on a transparent resin substrate; the material having a total light transmission of 72 to 91%, a haze value of 0.5 to 6%, a surface resistance of not more than 5Ω/sq. and an aperture ratio of about 80 to about 95%; and the geometric pattern of the conductive region having a line width of about 10 to about 30 μm.

Item 14. An electromagnetic wave shielding filter for a plasma display, the filter comprising an electromagnetic wave shielding material according to any one of Items 11 to 13.

Item 15. A process for forming a conductive region with a geometric pattern, the process comprising screen-printing in a geometric pattern a conductive paste comprising a particulate silver oxide, a tertiary fatty acid silver salt, and a solvent, onto a transparent porous layer surface of a transparent resin substrate having a transparent porous layer containing as a main component at least one member selected from the group consisting of oxide ceramics, non-oxide ceramics, and metals; and then performing heat treatment to form a conductive region with a geometric pattern on a transparent porous layer surface.

The present invention is described below in detail.

The electromagnetic wave shielding material production process of the present invention comprises screen-printing in a geometric pattern a conductive paste comprising a particulate silver oxide, a tertiary fatty acid silver salt, and a solvent, onto a transparent porous layer surface of a transparent resin substrate having a transparent porous layer containing as a main component at least one member selected from the group consisting of oxide ceramics, non-oxide ceramics, and metals; and heat-treating (baking) the printed substrate to form a conductive region with a geometric pattern on the transparent porous layer surface.

Transparent Resin Substrate

The base resin of the transparent resin substrate for use in the present invention is not limited, as long as it has high heat resistance, is transparent, and permits a transparent porous layer to be formed on the substrate.

Specific examples of such base resins include polyester resins such as polyethylene terephthalates (PETs), polyethylene naphthalates (PENs), etc.; polycarbonate resins; poly (meth)acrylate resins; silicone resins; cyclic polyolefin resins; polyarylate resins; polyether sulfone resins; and the like. Among such resins, from an overall evaluation of transparency, cost, durability, heat resistance, etc., polyester resins, and in particular PETs and PENs, are preferably usable.

The transparency of the transparent resin substrate is not limited as long as the transparency is such that the substrate can be used for a screen of a PDP, CRT or the like. The substrate usually has a total light transmission of about 85 to about 90% as measured according to JIS K7105, and a haze value of about 0.1 to about 3% as measured according to JIS K7105.

The transparent resin substrate has a form that can be used for screens of PDPs, CRTs, etc., i.e., has the form of a film, sheet, plate or the like. Such forms can be produced from base resins as mentioned above by known methods.

The transparent resin substrate for use in the present invention has a transparent porous layer containing as a main component at least one member selected from the group consisting of oxide ceramics, non-oxide ceramics, and metals.

Examples of oxide ceramics include simple oxides such as titania, alumina, magnesia, beryllia, zirconia, silica, etc.; silicates such as silica, forsterite, steatite, wollastonite, zircon, mullite, cordylite, spodumene, etc.; and double oxides such as aluminum titanate, spinel, apatite, barium titanate, PZT, PLZT, ferrite, lithium niobate, etc.

Examples of non-oxide ceramics include nitrides such as silicon nitride, sialon, aluminium nitride, boron nitride, titanium nitride, etc.; carbides such as silicon carbide, boron carbide, titanium carbide, tungsten carbide, etc.; and carbons such as amorphous carbon, graphite, diamond, single crystal sapphire, etc. Other examples include borides, sulfides, and silicides.

Examples of metals include gold, silver, iron, copper, nickel, etc.

At least one of these is used as a starting material, and silica, titania, and alumina are particularly preferable. There is no limitation on other components or the composition of the transparent porous layer.

The method for forming the transparent porous layer on the transparent resin substrate is not limited, and may be a wet process or dry process, with a wet process being preferable from the viewpoint of productivity and cost. A wet process can be performed by coating the substrate by a known technique. Examples of coating methods include gravure coating, offset coating, comma coating, die coating, slit coating, spray coating, plating, sol-gel processes, LB film processes, etc., among which sol-gel processes are particularly preferable. Starting materials usable in sol-gel processes include, for example, tetraethoxysilane, methyltriethoxysilane, tetrachlorosilane, etc. for forming a silica transparent porous layer; and aluminium tri-sec-butoxide, aluminium (III) 2,4-pentanedionate, etc. for forming an alumina transparent porous layer. Such starting materials undergo a sol-gel reaction in the presence of a catalyst and water. Also usable are hydrolyzates (reaction intermediates) of such starting materials in which a sol-gel reaction has proceeded. If necessary, other components such as resins, surfactants, etc., can be added. Examples of dry processes include CVD, vapor deposition, sputtering, ion plating, etc.

The transparent porous layer provided on the transparent resin substrate for use in the present invention usually has a thickness of about 0.05 to about 20 μm, and preferably about 0.1 to about 5 μm.

The transparent porous layer comprises an aggregate (agglomerate) of fine particles containing as a main component at least one member selected from the group consisting of oxide ceramics, non-oxide ceramics, and metals, and has pores between the fine particles. The transparent porous layer has a mean particle diameter of about 10 to about 100 nm, and a pore diameter of about 10 to about 100 nm. In the present invention, such a transparent porous layer provides excellent matching of the substrate with the conductive paste described hereinafter, and makes it possible to form a desired pattern.

The transparent resin substrate having such a transparent porous layer has the form of a film, sheet, plate or the like. When having the form of a film or sheet, the transparent resin substrate having the transparent porous layer usually has a thickness of about 25 to about 200 μm, and preferably about 40 to about 188 μm. In particular, for use in an electromagnetic wave shielding material for the entire surface of a display of a PDP or the like, the substrate preferably has a thickness of about 50 to about 125 μm. When the substrate has the form of a plate, it usually has a thickness of about 0.5 to about 5 mm, and preferably about 1 to about 3 mm.

With respect to transparency, the transparent resin substrate having the transparent porous layer has a total light transmission of about 85 to about 90% as measured according to JIS K7105, and a haze value of about 0.1 to about 3% as measured according to JIS K7105.

The transparent resin substrate for use in the present invention may be provided with a hard coat layer on a surface opposite the transparent porous layer.

For forming such a hard coat layer, generally used materials can be used without limitation, as long as they do not impair transparency. Among such materials, ultraviolet-curable acrylate resins are preferable. The main components of ultraviolet-curable acrylate resins are not limited, as long as they are ultraviolet-curable acrylates having bi- or polyfunctional groups, such as polyester acrylates, urethane acrylates, epoxy acrylates, etc. Preferably usable are bifunctional acrylates such as 1,6-hexanediol diacrylate, tripropylene glycol diacrylate, tetraethylene glycol acrylate, 1,9-nonanediol diacrylate, tricyclodecanedimethanol diacrylate, neopentyl glycol PO-modified diacrylate, EO-modified bisphenol A diacrylate, etc.; polyfunctional acrylates such as trimethylolpropane triacrylate, pentaerythritol triacrylate, ditrimethylolpropane tetraacrylate, dipentaerythritol hexaacrylate, trimethylolpropane EO-modified triacrylate, PO-modified glyceryl triacrylate, trishydroxyethyl isocyanurate triacrylate, etc.; and the like.

Photopolymerization initiators are usually added to ultraviolet-curable acrylate resins. A sufficiently cured film can be obtained by using 1-hydroxycyclohexyl phenyl ketone (Irgacure 184 manufactured by Ciba Speciality Chemicals), 2-hydroxy-2-methyl-1-1-phenyl-propan-1-one, or the like, as a photopolymerization initiator. Other usable photopolymerization initiators include, for example, benzoin, benzoin derivatives, benzophenone, benzophenone derivatives, thioxanthone, thioxanthone derivatives, benzyl dimethyl ketal, α-aminoalkylphenones, monoacylphosphine oxides, bisacylphosphine oxides, alkylphenyl glyoxylates, diethoxyacetophenone, titanocene compounds, etc.

Such photopolymerization initiators are preferably added in a proportion of 1 to 10 parts by weight per 100 parts by weight of ultraviolet-curable acrylate resin. Less than 1 part by weight of photopolymerization initiator cannot sufficiently initiate polymerization, whereas more than 10 parts thereof may lower durability of the hard coat layer.

Ultraviolet-curable acrylate resins as mentioned above may contain other components (such as UV absorbers, fillers and/or the like), as long as the transparency of the resin is not impaired.

A hard coat layer can be formed on the transparent resin substrate by a conventional coating method without limitation.

Provision of a hard coat layer on the transparent resin substrate prevents whitening and yellowing caused by precipitation of oligomers from the base resin at the time of baking described hereinafter. This ensures high transparency of the electromagnetic wave shielding material of the present invention. The hard coat layer can also prevent the electromagnetic wave shielding material being damaged during production.

Conductive Paste

The conductive paste for use in the present invention comprises a particulate silver oxide, a tertiary fatty acid silver salt, and a solvent.

The particulate silver oxide has a mean particle diameter of not more than 2 µm. When a particulate silver oxide with a greater particle diameter is used, the mean particle diameter thereof can be reduced to 2 µm or less during the production of the conductive paste (in the kneading step, synthesizing step, etc.). More preferably, the mean particle diameter is 200 to 500 nm. Use of a particulate silver oxide with a mean particle diameter of not more than 2 µm is preferable because it makes it easy for the conductive paste to pass through the mesh of a screen plate, thereby inhibiting breaking and spreading of thin lines printed on the transparent porous layer. Further, when using such a particulate silver oxide, reduction of the silver oxide and pyrolysis of the tertiary fatty acid silver salt occur at lower temperatures.

The tertiary fatty acid silver salt is a silver salt of a tertiary fatty acid having a total carbon number of 5 to 30, and preferably 10 to 30, and is capable of being dissolved or homogeneously dispersed in the dispersion medium used for producing the paste. The tertiary fatty acid silver salt serves as a lubricant, and during kneading of the silver oxide and tertiary fatty acid silver salt to obtain a paste, the tertiary fatty acid silver salt grinds the silver oxide to promote pulverization, and at the same time inhibits reaggregation of silver oxide particles by surrounding the silver oxide particles, thereby improving their dispersibility. This makes it possible to form a paste without using a binder. Further, during heating, silver is precipitated from the tertiary fatty acid silver salt, and serves to fuse the silver particles formed by the reduction of the silver oxide.

Specific examples of such tertiary fatty acid silver salts include silver pivalate, silver neoheptanoate, silver neononanoate, silver neodecanoate, etc. Tertiary fatty acid silver salts can be produced, for example, by neutralizing tertiary fatty acids with alkali compounds in water, and reacting the neutralized tertiary fatty acids with silver nitrate.

The ratio of particulate silver oxide to tertiary fatty acid silver salt in the conductive paste is preferably a weight ratio A/B of 1/4 to 3/1, wherein A is the weight of silver oxide and B is the weight of tertiary fatty acid silver salt.

The conductive paste contains a solvent in addition to the silver oxide and tertiary fatty acid silver salt. The solvent is not limited as long as it is not reactive with silver oxides or tertiary fatty acid silver salts and can readily disperse these compounds. Examples of usable solvents include organic solvents such as toluene and like aromatic hydrocarbons, triethylene glycol monobutyl ether and like ether esters of ethylene glycol, tripropylene glycol normal butyl ether and like ether esters of propylene glycol, terpineol, etc. The amount of solvent is about 1 to about 100 parts by weight per 100 parts by weight of particulate silver oxide.

When necessary, a dispersant can be added to satisfactorily disperse the particulate silver oxide and thereby prevent secondary aggregation of the particulate silver oxide. Examples of usable dispersants include hydroxypropylcellulose and like cellulose polymers, polyvinyl pyrrolidone, polyvinyl alcohol and like water-soluble polymers, etc. The amount of dispersant to be used is 0 to 20 parts by weight per 100 parts by weight of silver oxide.

The conductive paste for use in the present invention can be produced, for example, by mixing a particulate silver oxide, tertiary fatty acid silver salt and solvent, followed by kneading in a roll mill or the like to form a paste. Since the conductive paste contains a particulate silver oxide with a mean particle diameter of not more than 2 µm, it easily produces metallic silver particles even under relatively low-temperature heating conditions, and the metallic silver particles fuse together to form a continuous film or mass of metallic silver.

The conductive paste is adjusted to have a viscosity and thixotropic index suitable for screen printing, before being subjected to screen printing. The viscosity and thixotropic index can be suitably adjusted according to the particle size of particulate silver oxide, type of tertiary fatty acid silver salt, type of solvent, etc. For example, the conductive paste may have a viscosity of about 10 to about 10000 dPa·s, and a thixotropic index of about 0.1 to about 0.9.

Examples of such conductive pastes include "Dotite XA-9080" and "Dotite XA-9083" manufactured by Fujikura Kasei Co., Ltd., and the like.

Electromagnetic Wave Shielding Material

The electromagnetic wave shielding material of the present invention is produced by screen-printing the above-mentioned conductive paste on a transparent porous layer surface of a transparent resin substrate, followed by heat treatment.

The present invention has a feature in that a specific conductive paste is screen-printed on a specific transparent porous layer, thereby forming a patterned conductive region of thin lines that are substantially free from breaking and spreading.

The screen printing method is not limited, and may be a known method. For printing, a screen plate can be used which has a pattern capable of forming a conductive region that can effectively shield electromagnetic waves and that can maintain sufficient see-through property, and in particular a continuous geometric pattern such as grids, meshes, etc. For example, a screen plate can be used which comprises a 360 to 700-mesh stainless steel screen woven from stainless steel wires with a diameter of 11 to 23 μm, the stainless steel screen having a grid pattern with a line width of about 10 to about 30 μm and a pattern pitch of about 200 to about 400 μm.

Since a conductive paste containing fine particulate silver oxide is used in the screen printing according to the present invention, the printed pattern is substantially free from unevenness. Further, since the conductive paste matches well with the transparent porous layer, the thin lines of the pattern formed on the transparent porous layer substantially do not break or spread.

Generally, in principle, the line width of a screen-printed pattern tends to become slightly greater than the line width of the pattern of the screen plate. In the present invention, except for such a line width difference, the pattern of the screen plate can be substantially faithfully reproduced on the transparent porous layer, substantially without causing differences in line intervals or distortion of the pattern. When the tendency that the line width becomes greater is undesirable, the width of slits in the screen plate is selected so as to be smaller than the desired width of lines to be formed on the transparent porous layer. It is easy for those of ordinary skill in the art to select such a slit width.

Subsequently, the screen-printed electromagnetic wave shielding material is heat-treated (baked) at a low temperature of about 150 to about 200° C. (and preferably about 160 to about 180° C.) to form a conductive region with a grid pattern on the transparent porous layer. As described above, since the specific conductive paste is used, metallic silver particles easily fuse together even under relatively low-temperature heating conditions, thereby forming a continuous film of metallic silver. The heat treatment can be performed by, for example, external heating methods (such as steam-heated or electrically heated hot air, infrared heaters, heat rolls, etc.), internal heating methods (induction heating, high-frequency heating, resistance heating, etc.) and the like. The heating time is usually about 5 minutes to about 120 minutes, and preferably about 10 minutes to about 40 minutes.

The heat treatment (baking) may be performed in multiple stages. For example, a first-stage heat treatment can be performed at about 50 to about 60° C. for about 10 to about 20 minutes, and subsequently a second-stage heat treat can be performed at about 160 to about 180° C. for about 10 to about 40 minutes. When performing the heat treatment in multiple stages, the solvent is evaporated first, so that the spreading of the conductive paste can be further inhibited.

Thus, use of the above conductive paste enables formation of a silver layer at a low temperature within a short period of time, thereby avoiding adverse effects of heat on the transparent resin substrate. That is, it is possible to prevent whitening of the substrate due to oligomer precipitation from the substrate caused by heat, and yellowing of the substrate caused by heat.

Further, when the transparent resin substrate has a hard coat layer on a surface opposite the transparent porous layer, the substrate can be further prevented from whitening or yellowing during baking.

The electromagnetic wave shielding material of the present invention is thus produced. The electromagnetic wave shielding material of the present invention has a high aperture ratio of, for example, at least about 75%, and preferably about 80 to about 95%. This achieves high see-through property. As used herein, the aperture ratio means (Area B/Area A)×100 (%) in a grid pattern of the electromagnetic wave shielding material as shown in FIG. 4.

The line width (W) of the grid or mesh pattern of the conductive region is usually about 10 to about 30 μm, and preferably about 15 to about 20 μm. Production of a geometric pattern with a line width of less than about 10 μm tends to be difficult, whereas a pattern with a line width of more than 30 μm is likely to be conspicuous. Thus, patterns with line widths outside the above range are not preferable.

The intervals (pitch: P) of the lines of the grid or mesh pattern to be printed can be suitably selected within the range that satisfies the above aperture ratio and line width, and is usually about 200 to about 400 μm.

The thickness (the maximum height measured from the transparent porous layer surface in the perpendicular direction) of the thin lines can vary depending on the line width and other factors, but is usually at least about 1 μm, and preferably about 1 to about 30 μm.

The thin lines formed by screen printing on the transparent porous layer have approximately semicircular cross sections. In most of the reported patterns, which are formed by lithography, plating, etc., the thin lines have rectangular sections. Therefore, when an adhesive layer or the like is applied over such a pattern, bubbles are likely to remain and adversely affect the see-through property (FIG. 5 (b)). In contrast, in the present invention, since the thin lines have approximately semicircular cross sections, an adhesive layer or the like can be applied with good adhesion, with bubbles being unlikely to remain. This is advantageous in that the resulting electromagnetic wave shielding material has excellent see-through property (FIG. 5 (a)).

The electromagnetic wave shielding material of the present invention has high electromagnetic wave shielding effects, excellent transparency and excellent see-through property. Further, the electromagnetic wave shielding material also has a feature of low resistance, since the thin lines of the conductive region are substantially free from breaking. The electromagnetic wave shielding material of the present invention has a surface resistance of not more than 5Ω/sq., preferably not more than 3Ω/sq., and more preferably not more than 2Ω/sq. Too high a surface resistance is not preferable in respect of shielding characteristics.

The surface resistance of the shielding material having a conductive pattern can be determined according to the following formulae by selecting the line width and pitch of the pattern.

$$R = R_s \times (P/W)$$

$$R_s = \rho v/t$$

R: The surface resistance of the shielding material having a conductive pattern (Ω/sq.)
$R_s$: The surface resistance of the conductive paste (Ω·cm)
$\rho_v$: The volume resistivity of the conductive paste
t: The coating thickness of the conductive paste P: The intervals (pitch) of the grid or mesh pattern W: The line width of the grid or mesh pattern The electromagnetic wave shielding material of the present invention achieves a high total light transmission (JIS K7105) of about 72 to about 91%, and a low haze value (JIS K7105) of about 0.5 to about 6%.

Moreover, the conductive pattern formed on the transparent porous layer contains substantially no additives such as binders, curing agents, catalysts, etc., and mostly consists of silver particles, which are directly fused and bonded together to form a high-purity silver mass. Therefore, the electromagnetic wave shielding material of the present invention has low and stable resistance.

The electromagnetic wave shielding material of the present invention may further have a protective film laminated on the conductive region formed on the transparent porous layer. Known, generally used resins can be used for such a protective film. Such resins can be laminated by known methods, such as dry lamination, wet lamination, etc.

The electromagnetic wave shielding material of the present invention may further have a functional film or the like laminated thereon. Examples of functional films include antireflection films provided with antireflection layers to prevent film surface light reflection; films colored by pigmenting or addition of additives; near infrared ray shielding films that absorb or reflect near infrared rays; stainproof films that prevent stains such as fingerprints from adhering to the surface; etc.

The electromagnetic wave shielding material of the present invention has high electromagnetic wave shielding effects, excellent transparency and excellent see-through property. The production process of the present invention, which employs a screen printing method, is capable of forming a uniform conductive geometric pattern on a substrate, simply and with high precision. Therefore, the process can easily produce even an electromagnetic wave shielding front plate to be used on a display with a large screen area. Thus, the electromagnetic wave shielding material of the present invention is useful as an electromagnetic wave shielding filter for displays with large screen areas, such as cathode ray tubes (CRTs), plasma display panels (PDPs), etc.

Effects of the Invention

In the electromagnetic wave shielding material production process of the present invention, a specific conductive paste is screen-printed on a transparent porous layer provided on a substrate, the transparent porous layer containing as a main component at least one member selected from the group consisting of oxide ceramics, non-oxide ceramics, and metals, so that a conductive pattern that is substantially free from breaking and thickening of thin lines can be formed.

Further, since the patterned conductive paste can be baked at a low temperature, whitening and yellowing of the transparent resin substrate can be prevented, thereby maintaining the transparency of the substrate. In particular, when the transparent resin substrate has a hard coat layer, higher transparency can be maintained since the hard coat layer inhibits the influence of heat and moisture on the substrate during baking of the conductive paste. Since screen printing is used in the present invention, the process of the present invention naturally consists of a small number of steps and thus is simple, is also advantageous from the viewpoint of cost, and has high mass productivity and high continuous productivity for electromagnetic wave shielding materials.

Moreover, since the electromagnetic wave shielding material of the present invention produced by the above process has a conductive pattern that is substantially free from breaking of thin lines, the electromagnetic wave shielding material has a low resistance and high electromagnetic wave shielding effects. Thickening of the thin lines can also be inhibited, thereby ensuring a high aperture ratio (see-thorough property) and high transparency.

Therefore, the electromagnetic wave shielding material is particularly useful as an electromagnetic wave shielding filter used for displays with large screens, such as cathode ray tubes (CRTs), plasma display panels (PDPs), etc.

BRIEF DESCRIPTION OF DRAWINGS

FIG. 1 is an optical micrograph (magnification: ×100) of grid lines of the conductive region of the electromagnetic wave shielding material obtained in Example 1.

FIG. 2 is an optical micrograph (magnification: ×100) of grid lines of the conductive region of the electromagnetic wave shielding material obtained in Comparative Example 1.

FIG. 3 is an optical micrograph (magnification: ×100) of grid lines of the conductive region of the electromagnetic wave shielding material obtained in Comparative Example 2.

FIG. 4 is a schematic diagram showing a method for measuring an aperture ratio.

FIG. 5 is a sectional view of a thin line of a conductive pattern.

BEST MODE FOR CARRYING OUT THE INVENTION

The present invention is described below in more detail with reference to an Example and Comparative Examples, which by no means limit the scope of the invention.

The electromagnetic wave shielding effects, total light transmissions, haze values, sheet resistances, line widths, aperture ratios and line thicknesses in the Example and Comparative Examples were measured by the following methods.

1. Electromagnetic Wave Shielding Effect

Measured using a measuring device according to the Kansai Electronic Industry Development Center method (commonly known as the KEC method).

2. Total Light Transmission

Measured according to JIS K7105, using a turbidimeter Model NDH-20D (product of Nippon Denshoku Industries Co., Ltd.).

3. Haze Value

Measured according to JIS K7105, using a turbidimeter Model NDH-20D (product of Nippon Denshoku Industries Co., Ltd.).

4. Sheet Resistance

Measured using a Loresta EP (product of Dia Instruments Co., Ltd.).

5. Line Width

Measured using an optical microscope.

6. Aperture Ratio

Determined by the following procedure: the line width and line interval of one square of the grid pattern of the electromagnetic wave shielding material were measured using an optical microscope to calculate Areas A and B shown in FIG. 4, and the obtained values were substituted into the following equation.

$$\text{Aperture ratio (\%)} = (\text{Area } B/\text{Area } A) \times 100(\%)$$

7. Line Thickness

Measured using a surface roughness meter.

EXAMPLE 1

A polyethylene terephthalate film transparent substrate having an alumina membrane as a transparent porous layer (thickness of the layer: 20 µm) was used as a transparent resin substrate (thickness including the transparent porous layer: 120 µm; product of Pictorico; tradename "TPX"). An ultraviolet-curable acrylate hard coat agent (product of Dai Nippon Toryo Co., Ltd., tradename "UV Clear", solids content: 50 wt. %) was applied with a Meyer bar to a thickness of 2 µm (when cured) to the substrate surface opposite the transparent porous layer, dried at 80° C. for 2 minutes and irradiated with ultraviolet light at an intensity of 300 mJ/cm² to form a hard coat layer.

A grid pattern was printed on the porous layer surface of the film, with a screen printer (product of Newlong Seimitsu Kogyo Co., Ltd.), using a conductive paste (product of Fujikura Kasei Co., Ltd.; tradename "Dotite XA-9080").

The screen plate used was a screen plate (product of Nakanuma Art Screen Co., Ltd.) comprising a 500-mesh stainless steel screen woven from stainless steel wires with a diameter of 18 µm, the screen having a grid emulsion pattern with a line width of 20 µm, a pattern pitch of 250 µm and an aperture ratio of 84.6%.

After printing, the film with the silver compound paste was baked using electrically heated hot air at 55° C. for 15 minutes, and then at 150° C. for 30 minutes, to form a conductive region having a square grid pattern to thereby obtain an electromagnetic wave shielding material.

When grid lines of the conductive region of the obtained electromagnetic wave shielding material were observed with an optical microscope (magnification: ×100), substantially no breaking or spreading (thickening) of the lines was found (FIG. 1).

COMPARATIVE EXAMPLE 1

A polyethylene terephthalate film with a thickness of 175 µm (product of Toyobo Co., Ltd.; tradename "A4100"), which had no transparent porous layer, was used as a transparent resin substrate. An ultraviolet-curable acrylate hard coat agent (product of Dai Nippon Toryo Co., Ltd.; tradename "UV Clear"; solids content: 50 wt. %) was applied with a Meyer bar to a thickness of 2 µm (when cured) to the easily adhered surface of the substrate, dried at 80° C. for 2 minutes and irradiated with ultraviolet light at an intensity of 300 mJ/cm² to form a hard coat layer. The procedure of Example 1 was otherwise repeated to produce an electromagnetic wave shielding material. In the procedure, screen printing was performed on the film surface opposite the hard coat layer.

When grid lines of the conductive region of the obtained electromagnetic wave shielding material were observed with an optical microscope (magnification: ×100), many occurrences of oligomer precipitation and line spreading were found (FIG. 2).

COMPARATIVE EXAMPLE 2

An electromagnetic wave shielding material was produced in the same manner as Example 1 except for using, in place of the silver compound paste (product of Fujikura Kasei Co., Ltd.) containing a particulate silver oxide, a tertiary fatty acid silver salt, and a solvent, a polymer-type silver paste [product of Asahi Chemical Research Laboratory Co., Ltd.; tradename "SW-1100-1"; composition: 58.0 to 64.0% of silver particles (particle diameter: 3 to 5 µm), 0.8 to 1.2% of carbon powder (primary particle diameter: not more than 0.1 µm), 11.0 to 14.0% of polyester resin, 0.05 to 0.15% of additives, and the balance being ethylcarbitol acetate; viscosity: 200 to 300 Ps (Viscotester Model VT-04)]. When grid lines of the conductive region of the obtained electromagnetic wave shielding material were observed with an optical microscope (magnification: ×100), many occurrences of breaking and spreading of the lines were found (FIG. 3).

Table 1 shows the results of evaluating the electromagnetic wave shielding effects, total light transmissions, haze values and sheet resistances of the electromagnetic wave shielding materials of Example 1 and Comparative Examples 1 and 2.

TABLE 1

|  | Electromagnetic wave shielding effect (dB) | | | Total light transmission | Haze value | Sheet resistance | Line width | Aperture ratio | Line thickness |
|---|---|---|---|---|---|---|---|---|---|
|  | 100 MHz | 300 MHz | 500 MHz | (%) |  | (Ω/sq.) | (µm) | (%) | (µm) |
| Ex. 1 | 31 | 33 | 39 | 73.8 | 5.6 | 0.645 | 22.0 | 83.2 | 2.5 |
| Comp. Ex. 1 | 35 | 32 | 36 | 54.0 | 5.1 | 0.526 | 58.0 | 59.0 | 1.8 |
| Comp. Ex. 2 | 39 | 33 | 33 | 66.5 | 10.3 | 1.672 | 45.9 | 66.7 | 2.0 |

The invention claimed is:

1. A process for producing an electromagnetic wave shielding material, the process comprising: screen-printing in a geometric pattern a conductive paste comprising a particulate silver oxide, a tertiary fatty acid silver salt, and a solvent, onto a transparent porous layer surface of a transparent resin substrate having a transparent porous layer containing as a main component at least one member selected from the group consisting of oxide ceramics, non-oxide ceramics, and metals; and then heat-treating the printed transparent resin substrate to form a conductive region with a geometric pattern on the transparent porous layer surface, and
   wherein the electromagnetic wave shielding material has a total light transmission of about 72 to about 91%, a haze value of about 0.5 to about 6%, a surface resistance of not more than 5 Ω/sq., and an aperture ratio of about 80 to 95%,
   wherein the geometric pattern of the conductive region has a line width of about 10 to about 30 µm, and
   wherein the lines formed on the transparent porous layer have approximately semicircular cross sections.

2. A process according to claim 1, wherein the transparent resin substrate has a hard coat layer on a surface opposite the transparent porous layer.

3. The process according to claim 1, wherein the conductive paste contains a particulate silver oxide with a mean particle diameter of not more than 2 µm, a silver salt of a tertiary fatty acid having a total carbon number of 5 to 30, and a solvent containing as a main component at least one member selected from the group consisting of aromatic hydrocarbons, ether esters of ethylene glycol, ether esters of propylene glycol, and terpineol.

4. A process according to claim 1, wherein the transparent porous layer has a thickness of about 0.05 to about 20 µm.

5. A process according to claim 1, wherein the transparent porous layer comprises an aggregate of fine particles containing as a main component at least one member selected from the group consisting of silica, titania, and alumina, and has pores between the fine particles.

6. A process according to claim 5, wherein the fine particles have a mean particle diameter of about 10 to about 100 nm, and wherein the pores have a diameter of about 10 to about 100 nm.

7. A process according to claim 1, wherein the transparent porous layer is formed by a method selected from the group consisting of gravure coating, offset coating, comma coating, die coating, slit coating, spray coating, plating, sol-gel processes, LB film processes, CVD, vapor deposition, sputtering, and ion plating.

8. A process according to claim 1, wherein the heat treatment is carried out at a temperature of about 150 to about 200° C.

9. A process according to claim 1, wherein the transparent resin substrate comprises at least one resin selected from the group consisting of polyester resins, polycarbonate resins, poly(meth)acrylate resins, silicone resins, cyclic polyolefin resins, polyarylate resins, and polyether sulfone resins.

10. A process according to claim 1, wherein the transparent resin substrate has a form of a sheet, a film, or a plate.

11. An electromagnetic wave shielding material produced by a process according to claim 1.

12. An electromagnetic wave shielding filter for a plasma display, the filter comprising an electromagnetic wave shielding material according to claim 11.

13. A film-form electromagnetic wave shielding material comprising a conductive region with a geometric pattern formed on a transparent resin substrate;
the material having a total light transmission of 72 to 91%, a haze value of 0.5 to 6%, a surface resistance of not more than 5 Ω/sq. and an aperture ratio of about 80 to about 95%; the geometric pattern of the conductive region having a line width of about 10 to about 30 μm, and
the lines formed on the transparent porous layer having approximately semicircular cross sections, and
wherein the material is obtained by the process comprising screen-printing in the geometric pattern a conductive paste comprising a particulate silver oxide, a tertiary fatty acid silver salt, and a solvent, onto a transparent porous layer surface of the transparent resin substrate having a transparent porous layer containing as a main component at least one member selected from a group consisting of oxide ceramics, non-oxide ceramics, and metals; and then heat-treating the printed transparent resin substrate to form the conductive region with the geometric pattern on the transparent porous layer surface.

14. A process for forming a conductive region with a geometric pattern, the process comprising screen-printing in a geometric pattern a conductive paste comprising a particulate silver oxide, a tertiary fatty acid silver salt, and a solvent, onto a transparent porous layer surface of a transparent resin substrate having a transparent porous layer containing as a main component at least one member selected from the group consisting of oxide ceramics, non-oxide ceramics, and metals; and then performing heat treatment to form a conductive region with a geometric pattern on the transparent porous layer surface,
wherein the geometric pattern of the conductive region has a line width of about 10 to about 30 μm, and
wherein the lines formed on the transparent porous layer have approximately semicircular cross sections.

* * * * *